United States Patent [19]

Ohshima et al.

[11] Patent Number: 4,502,207
[45] Date of Patent: Mar. 5, 1985

[54] WIRING MATERIAL FOR SEMICONDUCTOR DEVICE AND METHOD FOR FORMING WIRING PATTERN THEREWITH

[75] Inventors: Jiro Ohshima, Kawasaki; Masahiro Abe, Yokohama; Yutaka Koshino, Yokosuka, all of Japan

[73] Assignee: Toshiba Shibaura Denki Kabushiki Kaisha, Japan

[21] Appl. No.: 562,212

[22] Filed: Dec. 16, 1983

[30] Foreign Application Priority Data

Dec. 21, 1982 [JP] Japan .................. 57-224168
Apr. 20, 1983 [JP] Japan .................. 58-68370

[51] Int. Cl.³ ............................................ H01L 21/28
[52] U.S. Cl. ........................ 29/576 B; 29/571; 29/591; 148/1.5; 148/31.5; 148/33.6; 428/620; 420/537; 357/67
[58] Field of Search .......... 29/569 R, 571, 576 R, 29/576 B, 578, 589, 591, 590; 428/620, 654, 650; 420/528, 529, 537, 548; 148/1.5, 177, 31.5, 33.6; 357/65, 67

[56] References Cited

U.S. PATENT DOCUMENTS

| | | | |
|---|---|---|---|
| 3,984,619 | 10/1976 | Rau et al. | 420/537 X |
| 4,170,469 | 10/1979 | Mori | 420/537 X |
| 4,213,799 | 7/1980 | Raghaven et al. | 420/537 |
| 4,213,800 | 7/1980 | Mayo et al. | 420/537 |

FOREIGN PATENT DOCUMENTS

| | | | |
|---|---|---|---|
| 2057499 | 4/1981 | United Kingdom | 420/537 |
| 255579 | 10/1969 | U.S.S.R. | 420/537 |
| 313886 | 9/1971 | U.S.S.R. | 420/537 |
| 650365 | 2/1981 | U.S.S.R. | 420/537 |

*Primary Examiner*—Brian E. Hearn
*Assistant Examiner*—David A. Hey
*Attorney, Agent, or Firm*—Finnegan, Henderson, Farabow, Garrett & Dunner

[57] ABSTRACT

A wiring material of a semiconductor device, which comprises aluminum as a major component and at least a surface layer of the wiring layer is alloyed with boron and silicon. A method for forming a wiring material of a semiconductor device, which comprises the steps of: forming a wiring pattern comprising aluminum as a major component on a semiconductor element; and ion-implanting one of boron and a mixture of boron and silicon in the wiring pattern and alloying at least a surface layer of the wiring pattern to form an alloy layer containing aluminum, boron and silicon.

2 Claims, 4 Drawing Figures

4,502,207

WIRING MATERIAL FOR SEMICONDUCTOR DEVICE AND METHOD FOR FORMING WIRING PATTERN THEREWITH

BACKGROUND OF THE INVENTION

1. Field of the Invention

The present invention relates to a semiconductor device using a new and improved wiring material and, more particularly, to a wiring material of a semiconductor device and a method for forming a wiring pattern therewith, wherein a self diffusion phenomenon and a creep phenomenon which are caused by stress between a wiring material and a passivation film can be reduced.

2. Description of the Prior Art

Conventionally, aluminum or an alloy of aluminum and silicon is used as a wiring material of a semiconductor device. A passivation film is formed on an Al alloy wiring layer (including an Al wiring layer) to protect a semiconductor element. A silicon nitride (SiN) film formed by plasma CVD is receiving a great deal of attention as a passivation film formed on a wiring layer since the SiN film prevents external contamination and can be formed at a low temperature. Furthermore, such a SiN film has high reliability, good workability and good step coverage.

However, when a silicon nitride film is formed by plasma CVD on a wiring layer, an Al alloy tends to disappear. This phenomenon occurs when annealing is performed on a structure (FIG. 1) wherein a lower wiring layer 2 is formed on a substrate 1 having a semiconductor device thereon, an upper wiring layer 3 is formed on the lower wiring layer 2 through an insulating layer 6 so as to cross the lower wiring layer 2, and a silicon nitride film 4 is formed on the upper wiring layer 3 by plasma CVD. As is apparent from FIG. 2, narrowed portions 5 are formed in the upper wiring layer 3 at intersections between the upper and lower wiring layers 3 and 2 as if the wiring material has disappeared. The number of narrowed portions increases upon annealing at a temperature of 500° C. for about 10 minutes. Therefore, annealing conditions in the manufacture of semiconductor devices are greatly restricted.

This phenomenon occurs due to thermal stress which is caused by a difference between thermal expansion coefficients of the silicon nitride film and the wiring layer. The stress can be decreased by increasing the content of silicon in the silicon nitride film. In this case, however, the electrical characteristics of the silicon nitride film as the passivation film are degraded, resulting in a disadvantage.

SUMMARY OF THE INVENTION

It is an object of the present invention to provide a semiconductor device having a passivation film of a new and improved material for preventing a disappearance phenomenon of the wiring material which is caused by annealing (sintering during the process) and a thermal history after manufacture, and, more particularly, to provide a semiconductor device having a wiring layer which is free from the disappearance phenomenon even if a silicon nitride film is formed by plasma CVD on the wiring layer.

According to an aspect of the present invention, there is provided a wiring material of a semiconductor device wherein the wiring material of at least a surface layer of a wiring layer comprising aluminum as a major component and formed on a semiconductor element is alloyed with boron and silicon.

According to another aspect of the present invention, there is provided a wiring material of a semiconductor device wherein the wiring material of at least a surface layer of the wiring layer comprising aluminum as a major component and formed on a semiconductor element is alloyed with boron, silicon and copper.

According to still another aspect of the present invention, there is provided a method for forming a wiring pattern of a semiconductor device, comprising the steps of: forming a wiring pattern comprising aluminum as a major component on a semiconductor element; ion-implanting one of boron and a mixture of boron and silicon in the wiring pattern and alloying at least a surface layer of the wiring pattern to form an alloy layer containing aluminum, boron and silicon; and forming a protective film on a surface of a semiconductor substrate which includes the wiring pattern.

The present inventors have examined a portion which is subjected to thermal stress and a composition of the portion, based on the fact that the disappearance phenomenon of the Al alloy wiring layer is caused by a great stress when the silicon nitride film is formed by plasma CVD. The present inventors have found that the disappearance phenomenon does not occur in a micropattern if an Al alloy containing silicon and boron is formed as a surface layer of the wiring pattern.

DETAILED DESCRIPTION OF THE PREFERRED EMBODIMENTS

A total content of silicon (Si) and boron (B) is preferably less than 10% in an alloyed layer obtained when an Al wiring layer is alloyed using silicon and boron.

The ratio of boron to silicon is from 1:10 to 1:2 and preferably from 2:9 to 4:9 (about 1:3). When the ratio of B to Si falls within the above range, the B serves to produce $AlB_2$ and the Si serves to produce a eutectic cyrstal of Al and Si. $AlB_2$ and the eutectic crystal work together to prevent the self diffusion and creep phenomena of a wiring layer comprising the three or four-element alloy. As a result, even if annealing is performed during the process of manufacturing the semiconductor device, the disappearance phenomenon of a micropattern will not occur.

This wiring layer can also be obtained using a three-element alloy of Si, B and Al. This alloy is sputtered as a source to obtain the resultant alloy. However, it is preferred that an Al wiring layer or an Al+Si wiring layer is first prepared, and that B or a mixture of B and Si is then ion-implanted in the prepared wiring layer.

The wiring layer having Al as its major component can contain 0.3% to 3% of Cu. The Cu element serves to perform electromigration and provide a corrosion preventive effect.

EXAMPLE 1

An example will be described wherein an Al-Cu-Si-B alloy is formed as a surface layer of the wiring layer.

An insulating film was formed on a substrate having a predetermined semiconductor element, and contact holes were formed in the insulating film. An Al-Cu(2.0%)-Si(1.5%) alloy was deposited on the insulating pattern by sputtering so as to form an alloy layer having a thickness of 1.0 μm. B+ was ion-implanted in the surface of the alloy layer at an acceleration voltage of 40 kV and a dose of $5\times10^{15}$ cm$^{-2}$, and Si+ was ion-implanted to a depth of 1,000 to 2,000 Å at an acceleration voltage of 50 kV and a dose of $5\times10^{15}$ cm$^{-2}$. Thereafter, the alloy layer was patterned to form a wiring pattern having a width of 5 μm, and a CVD-SiN film was formed by plasma CVD thereon.

The resultant structure (Sample A) was annealed in a nitrogen atmosphere at a temperature of 500° C. so as to examine the number of narrowed portions per pattern length of 640 μm as a function of annealing time. The result is indicated by a line A.

A similar wiring pattern was formed using an Al-Cu(2.0%)-Si(2.0%) alloy, and the same CVD-SiN film was formed on the wiring pattern, thereby preparing Sample B as a Comparative Example. Si was ion-implanted in an Al-Cu(2.0%)-Si(2.0%) alloy layer at an acceleration voltage of 50 kV and a dose of $1\times10^{16}$ cm$^{-2}$ to a depth of 1,000 to 2,000 Å. A similar wiring pattern was formed, and the same plasma CVD-SiN film was formed thereon, thus preparing Sample C as a Comparative Example. The characteristics of Samples B and C are given as lines B and C, respectively.

Figure 1:
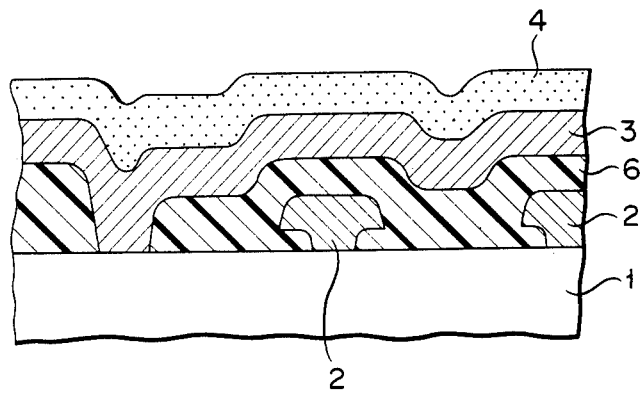
FIG. 1 is a sectional view of a semiconductor element for explaining a wiring layer disappearance phenomenon in a semiconductor device.
Figure 2:
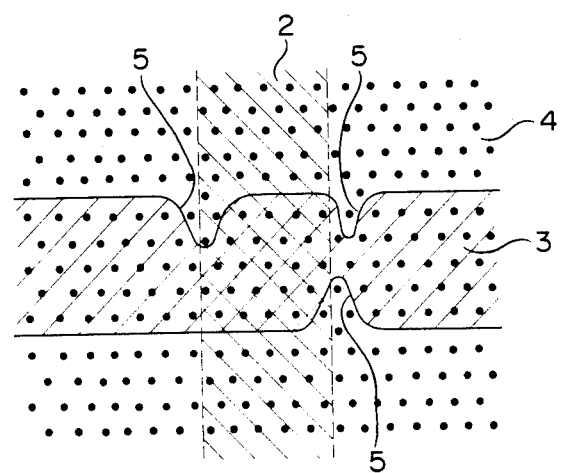
FIG. 2 is a plan view of the semiconductor element shown in FIG. 1.
Figure 3:
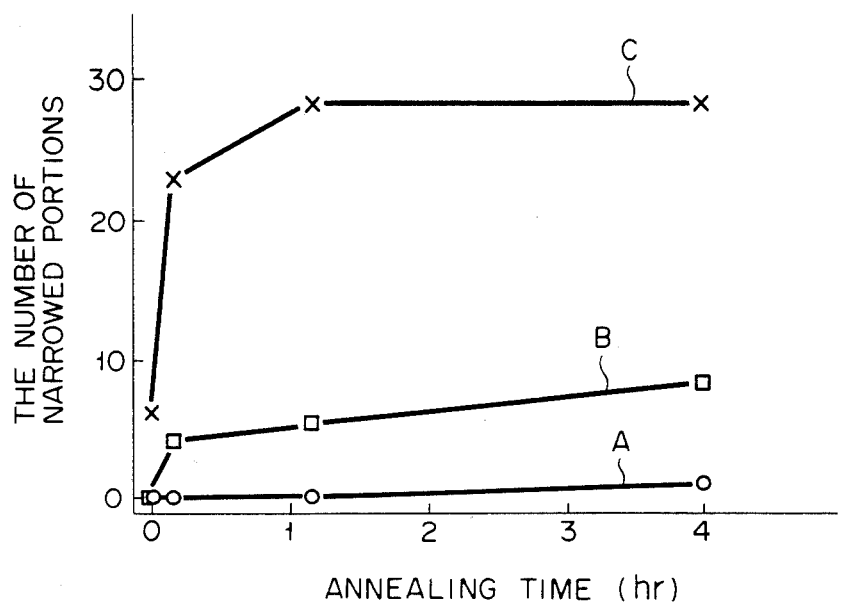
FIGS. 3 and 4 are graphs each showing the characteristics of a wiring material of the present invention and comparative examples.

As is apparent from FIG. 3, in Sample A (line A), the disappearance phenomenon does not occur even if Sample A is annealed at a temperature of 500° C. for one hour. Furthermore, even if the annealing time is extended to 4 hours, only one narrowed portion is found. However, in the Comparative Examples (B and C), many narrowed portions appear within time periods as short as 10 minutes. 28 and 8 narrowed portions are found after 4 hours in Samples C and B, respectively.

In the wiring disappearance test, if no narrowed portion is found in a unit straight pattern length of 640 μm of Sample A, the disappearance phenomenon of the wiring material can be regarded as being substantially eliminated. Annealing at a temperature of 500° C. for one hour in an atmosphere of N$_2$ gas is deemed to be a practical accelarated test from the viewpoint of manufacture of semiconductor devices. A semiconductor device which is subjected to this test and which has no narrowed portion can be regarded as being a satisfactory product.

FIG. 3 is a graph showing the results when the occurrence of the narrowed portions is examined at a pattern width of 5 μm. Furthermore, such an examination was carried out for various pattern widths in the range between 2 μm and 13 μm so as to determine the rate of nondefective semiconductor devices, and the results are shown in FIG. 4.

Figure 4:
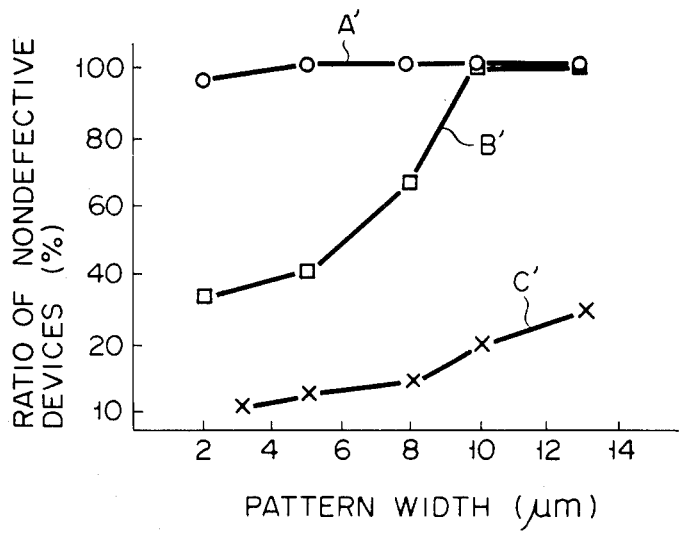

As is apparent from FIG. 4, the proportion of nondefective semiconductor devices greatly decreases according to the results (a line B') for the structure (Sample B) using the Al-Cu-Si alloy and the results (a line C') for the structure (Sample C) obtained by ion-implanting Si in the Al-Cu-Si alloy when the micropattern width is set to be 2 μm. However, according to the results (a line A') for the structure (Sample A) using the Cu-Si-B alloy according to the present invention, the proportion of nondefective semiconductor devices remains high even if the pattern width is set to be 2 μm. Thus, the present invention is very effective as a wiring technique for VLSI architecture.

EXAMPLE 2

A predetermined semiconductor element was formed on a semiconductor substrate, and an insulating film was formed thereon. After the insulating film was patterned to form contact holes, a four-element alloy layer having a thickness of 1.0 μm was formed by sputtering using Cu(2.0%)-Si(1.5%)-B(0.5%)-Al(balance) as a source to cover the entire surface. The wiring layer film was then patterned to obtain a wiring pattern having a width of 5 μm. The CVD-SiN film was then formed on the wiring pattern in the same manner as in Example 1 to a thickness of 1.0 μm. The same annealing as in Example 1 was performed. The resultant structure provides substantially the same effect as Sample A.

EXAMPLE 3

In this example, ion-implantation was performed with respect to a surface layer of an Al wiring layer so as to form an Al-B-Si alloy.

A predetermined semiconductor element, an insulating film and contact holes were sequentially formed on a semiconductor substrate. Aluminum was sputtered on the resultant structure to a thickness of 1.0 μm.

B+ was then ion-implanted in the alloy layer at an acceleration voltage of 40 kV and a dose of $5\times10^{15}$ cm$^{-2}$ and then Si+ was ion-implanted in the alloy layer at an acceleration voltage of 50 kV and a dose of $5\times10^{15}$ cm$^{-2}$ to a depth of 1,000 to 2,000 Å. Thereafter, a wiring pattern having a width of 5 μm was formed, and a plasma CVD-SiN film was formed thereon.

The resultant structure was then sintered in a nitrogen atmosphere at a temperature of 500° C. so as to examine the number of narrowed portions per unit pattern length of 640 μm as a function of sintering time. A line which is substantially the same as the line A in FIG. 3 was obtained.

EXAMPLE 4

In this example, an Al-B-Si alloy was formed by ion implantation in a surface layer of the Al-Si wiring layer.

An Al-Si(0.8-5%) alloy was formed by sputtering on a semiconductor substrate to a thickness of 1.0 μm. B+ was then ion-implanted in the surface of the alloy layer at an acceleration voltage of 40 kV and a dose of $5\times10^{15}$ cm$^{-2}$ to a depth of 1,000 to 2,000 Å. Thereafter, a wiring pattern having a width of 5 μm was formed, and a plasma CVD-SiN film was formed thereon.

The resultant structure was then sintered in a nitrogen atmosphere at a temperature of 500° C. so as to examine the number of narrowed portions per unit pattern length of 640 μm as a function of sintering time. A line which is substantially the same as the line A in FIG. 3 was obtained.

EXAMPLE 5

Example 5 is substantially the same as Example 3 except that an alloy layer having a thickness of 1.0 μm was formed by sputtering using an Al-Cu(2.0%) alloy in place of aluminum. In particular, B+ and Si+ were ion-implanted under the same conditions as in Example 3, and a plasma CVD-SiN film was formed on the resultant wiring pattern. The resultant structure was examined in the same manner as in Example 3 so as to obtain the number of narrowed portions per unit pattern length of 640 μm as a function of sintering time. A line which is substantially the same as the line A in FIG. 3 was obtained.

EXAMPLE 6

Example 6 is substantially the same as Example 4 except that an alloy layer having a thickness of 1.0 m was formed by sputtering using the Al-Si(0.8-5%)-Cu(2%) on a semiconductor substrate. B+ was ion-implanted under the same conditions as in FIG. 4. A plasma CVD-SiN film was formed on the resultant wiring pattern. The resultant structure was examined in the same manner as in Example 4 so as to obtain the number of narrowed portions per unit length of 640 μm as a function of sintering time. A line which is substantially the same as the line A in FIG. 3 was obtained.

What is claimed is:

1. A method for forming a wiring material of a semiconductor device, comprising the steps of: (i) forming a wiring pattern comprising aluminum as a major component on a semiconductor element; (ii) ion-implanting one of boron and a mixture of boron and silicon in said wiring pattern and alloying at least a surface layer of said wiring pattern to form an alloy layer containing aluminum, boron and silicon; and (iii) forming a protective film on a surface of said semiconductor substrate which includes said wiring pattern.

2. A method according to claim 1, wherein the wiring pattern in the step (i) contains 0.3 to 3% of copper in advance.

* * * * *